United States Patent [19]
Lin et al.

[11] Patent Number: 5,567,638
[45] Date of Patent: Oct. 22, 1996

[54] METHOD FOR SUPPRESSING BORON PENETRATION IN PMOS WITH NITRIDIZED POLYSILICON GATE

[75] Inventors: Yung-Hao Lin, Feng-Yuan; Chao-Sung Lai, Ilan; Chung-Len Lee; Tan-Fu Lei, both of Hsinchu, all of Taiwan

[73] Assignee: National Science Council, Taipei, Taiwan

[21] Appl. No.: 490,401

[22] Filed: Jun. 14, 1995

[51] Int. Cl.⁶ .................................................. H01L 21/265
[52] U.S. Cl. ................... 437/46; 437/40; 437/242
[58] Field of Search ................... 437/46, 18, 20, 437/40 GS, 41 GS, 191, 241, 242, 980; 148/DIG. 112, DIG. 114

[56] References Cited

U.S. PATENT DOCUMENTS

| | | | |
|---|---|---|---|
| 4,808,261 | 2/1989 | Ghidini et al. | 437/191 |
| 5,104,818 | 4/1992 | Silver | 437/46 |
| 5,376,593 | 12/1994 | Sandhu et al. | 437/242 |
| 5,382,533 | 1/1995 | Ahmad et al. | 437/24 |
| 5,422,291 | 6/1995 | Clementi et al. | 437/43 |

FOREIGN PATENT DOCUMENTS 1-191449  8/1989  Japan ............................ 148/DIG. 112

OTHER PUBLICATIONS

Lin et al., Nitridation of the Stacked Poly-Si Gate to Suppress the Boron Penetration in pMOS, pp. 248–249, ©Jun. 1995 IEEE.

*Primary Examiner*—Tom Thomas
*Assistant Examiner*—S. Mulpuri
*Attorney, Agent, or Firm*—Frost & Jacobs

[57] ABSTRACT

A method for suppressing boron penetration in a PMOS with a nitridized polysilicon gate includes steps of 1) growing a layer of gate oxide on a substrate, 2) forming at least one first polysilicon layer on the gate oxide layer, 3) nitridizing the first polysilicon layer, 4) forming a second polysilicon layer on the first polysilicon layer; and 5) implanting B-containing ions into the first and second polysilicon layers for constructing a PMOS structure wherein the nitridizing step suppresses a boron ion from penetration into the substrate. The present invention is characterized in nitridation on a polysilicon gate instead of a gate oxide which can effectively suppress boron penetration, avoid drawbacks resulting from nitridizing a gate oxide, and moreover, improve the reliability of the device owing to the slight nitridation effect in the polysilicon gate and the gate oxide.

14 Claims, 10 Drawing Sheets

METHOD FOR SUPPRESSING BORON PENETRATION IN PMOS WITH NITRIDIZED POLYSILICON GATE

FIELD OF THE INVENTION

The present invention is related to a method for suppressing boron penetration in PMOS, and more particularly to a method for suppressing boron penetration in PMOS with nitridized polysilicon gate.

BACKGROUND OF THE INVENTION

It is known that a complementary MOSFET (CMOS) consisting of NMOS and PMOS is a major device of an IC. With the size of devices that is getting smaller, a $P^+$-type polysilicon gate is required for imparting the PMOS with a feature of surface channel, so as to avoid therefor short channel effect. $BF_2^+$ ions are usually implanted for simultaneously forming the $P^+$ polysilicon gate and a $P^+$-N shallow junction. However, fluorine ions will enhance the penetration of boron ions through gate oxide which introduces boron ions to a Si substrate under the gate oxide. As a result, the reliability of the device is degraded, such as the increase of threshold voltage in a positive direction, and the enlargement of interface state density and charge trapping rate of the gate oxide layer.

There are papers suggesting that by means of growing or annealing the gate oxide with $N_2O$, or annealing the gate oxide with $NH_3$, the boron penetration can be suppressed by the nitride layer of gate oxide interface, but $N_2O$ grown or annealed gate oxide layer is not effective concerning suppressing boron penetration. On the other hand, the $NH_3$-annealed gate oxide degrades reliability of the device due to the involvement of hydrogen. Additionally, there is also proposed to use amorphous silicon gate to suppress boron penetration. Since amorphous silicon grows very slow and tends to block up the gas pipeline in LPCVD, so it is not suitable for industrial mass production.

SUMMARY OF THE INVENTION

An object of the present invention is to provide a method of suppressing boron penetration in PMOS with nitridized polysilicon gate, which is to nitridize between two layers of polysilicon gate in the multi-layer polysilicon gate of a PMOS for preventing boron penetration effect so as to enhance the device reliability.

The present invention is a method of suppressing boron penetration in PMOS with nitridized polysilicon gate which includes the following steps: (1) growing a layer of gate oxide on a Si substrate; (2) forming at least one first polysilicon layer on the gate oxide layer; (3) nitridizing the first polysilicon layer; (4) forming a second polysilicon layer on the first polysilicon layer; and (5) implanting B-containing ions into the first and second polysilicon layers for constructing a PMOS structure wherein the nitridizing step suppresses a boron ion from penetration into the substrate.

The B-containing ions are $BF_2^+$ ions, the substrate is a Si-based substrate, and the "at least one" means two.

The Si substrate in the Step 1) is an N-type Si substrate in a direction of (1, 0, 0) with a resistor of 5~10 $\Omega/cm^2$.

The gate oxide layer in the step 2) is grown for 80 minutes in a condition that rates of $O_2$ volume over time and $N_2$ volume over time are in a ratio of 1:6 at 900° C. and has a thickness of 80Å.

The at least one first polysilicon layer is grown to a thickness of 1000 Å under 625° C. in a low-pressure CVD (LPCVD) system.

$NH_3$ is used for the nitridation in the step 3).

The step 3) is taken place under a nitridation pressure of 120 mtorr at 900° C. for 80 minutes.

Between steps 3) and 4), a step of removing a layer of nitridized silicon which is generated by the nitridizing step 3) on the at least one first polysilicon layer with diluted HF is further included.

The second polysilicon layer in the step 4) is grown at 625° C. in a LPCVD system and has a thickness of 1000Å.

In the step 5), an ion implantation energy is 50 kev and an ion implanting dosage is $5 \times 10^{15}$ number/cm$^2$.

Step 5) is followed by steps of annealing the substrate in $O_2$ at 800° C. for 30 minutes to form a polysilicon oxide layer on the second polysilicon layer, and annealing the substrate in $N_2$ at 900° C. for 10~40 minutes to activate the boron-containing ions.

After annealing the substrate in the $N_2$, it is followed by a step of using diluted HF to remove the polysilicon oxide layer generated in the $O_2$-annealing step.

The present invention may best be understood through the following description with reference to the accompanying drawings, in which:

DETAILED DESCRIPTION OF THE PREFERRED EMBODIMENT

Figure 1A:
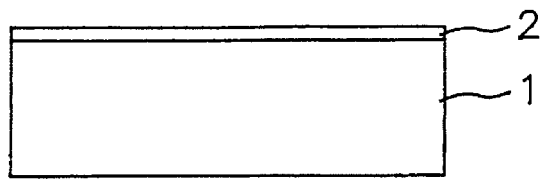
FIGS. 1A~1E are schematic views showing the manufacturing procedures according to the present invention.
Figure 1B:
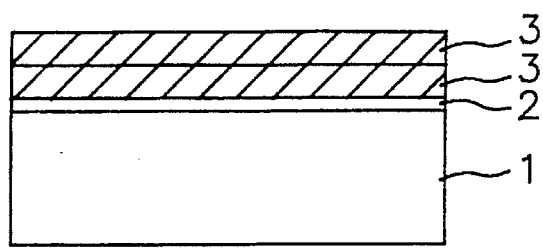
Figure 1C:
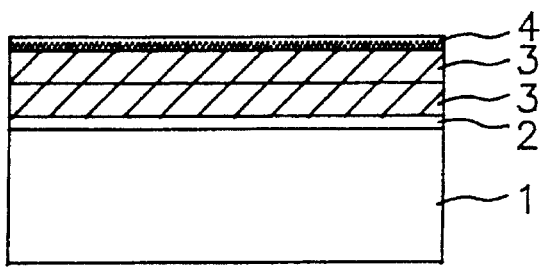
Figure 1D:
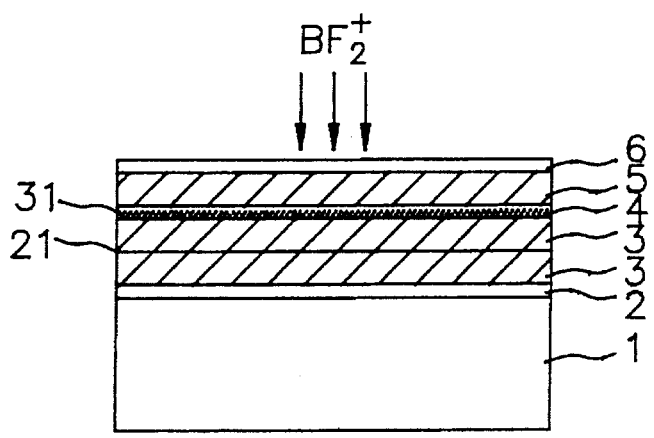
Figure 1E:
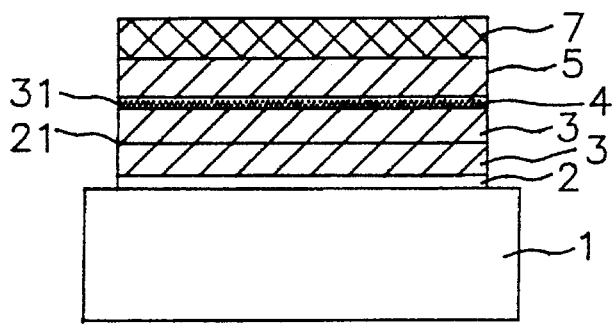

Referring to FIG. 1, a preferred embodiment according to the present invention includes the following steps:

1) in a condition that rates of $O_2$ volume over time and $N_2$ volume over time are in a ratio of 1:6, growing a 80Å layer of gate oxide 2 at 900° C. for 80 minutes on top of an n-type (1,0,0) Si substrate 1 with a resistor of 5–10 $\Omega/cm^2$, as shown in FIG. 1A;
2) forming two layers of the first polysilicon 3, both having a thickness of 1000Å, at 625° C. in a LPCVD system (as shown in FIG. 1B);
3) nitridizing the first polysilicon 3 with $NH_3$ at pressure of 120 mtorr and temperature of 900° removing with diluted HF a nitridized silicon layer (not shown) formed during the period of nitridation, in which after the nitridation, many nitrogen atoms are distributed above the first polysilicon 3 (as shown in FIG. 1C);
4) growing a second polysilicon 5 having a thickness of 1000Å at 625° C. in a LPCVD system;
5) implanting $BF_2^+$ ions into those layers of polysilicon with an implanting energy of 50 Kev and the implanting ion dosage of $5\times10^{15}$ number/$cm^2$, as shown in FIG. 1D;
6) annealing in $O_2$ at 800° C. for 30 minutes to form a layer of polysilicon oxide 6 on top of the second polysilicon 5 for preventing $BF_2^+$ ions from spreading out which thereby increases the resistor of the polysilicon gate in the subsequent $N_2$-annealing procedure;
7) annealing in $N_2$ at 900° C. respectively for 10 minutes, 20 minutes, 30 minutes, and 40 minutes, by which the effect of suppressing boron penetration is discussed;
8) removing with diluted HF the polysilicon oxide layer 6 formed in the $O_2$ annealing step; and
9) depositing a layer of Al 7 having a thickness of 4000Å which then is annealed in $N_2$ at 400° C. for 30 minutes.

Then a positive photoresistor is formed and exposed to generate a device pattern outside of which, the Al 7 and those polysilicon layers are etched by a chemical solution. Finally, a layer of Al is deposited on the back of Si substrate 1 to construct a PMOS structure (not shown) which will not be further discussed since it is a known structure for those who are skilled in the art.

From the illustration of the above embodiment, to avoid the drawbacks of nitridized gate oxide and preserve the effect of suppressing boron ion penetration, the applicant changes the subject to be nitridized, namely, polysilicon gate is to be nitridized instead. The structure of this type of polysilicon gate may include two layers, three layers, or even more layers of polysilicon Separately stacked, and nitridation may take place between any two layers, e.g., first and second layers, or second and third layers. The nitridation can be achieved by high-temperature gas nitridation of $NH_3$ or $N_2O$, :or plasma nitridation. In this way, the above-mentioned drawbacks can be avoided, and in addition, the breakdown charge and breakdown field of the gate oxide layer are greatly enlarged. The nitrogen barrier formed in the polysilicon gate can present the fluorine ion from being spread out and reduce the amount of fluorine ion gathered in the gate oxide, so as to suppress the effect of boron penetration urged by the flourine ion. Hence, nitridizing the polysilicon gate can suppress boron penetration through the gate oxide layer into the Si substrate thereunder, and consequently enhance device reliability and other related properties, such as a fifteen-time stronger breakdown charge, and a breakdown field over 18 MV/cm which are larger than those values that have been published.

The following analysis is about the effect of suppressing boron penetration with a three-layer polysilicon gate structure (hereinafter referred to as PPHP) after being nitridized. On the other hand, a similar three-layer polysilicon gate structure (hereinafter referred to as PPP) is produced by three-step stacking at 625° C. in a LPCVD system without nitridation to be compared with PPHP.

Figure 2:
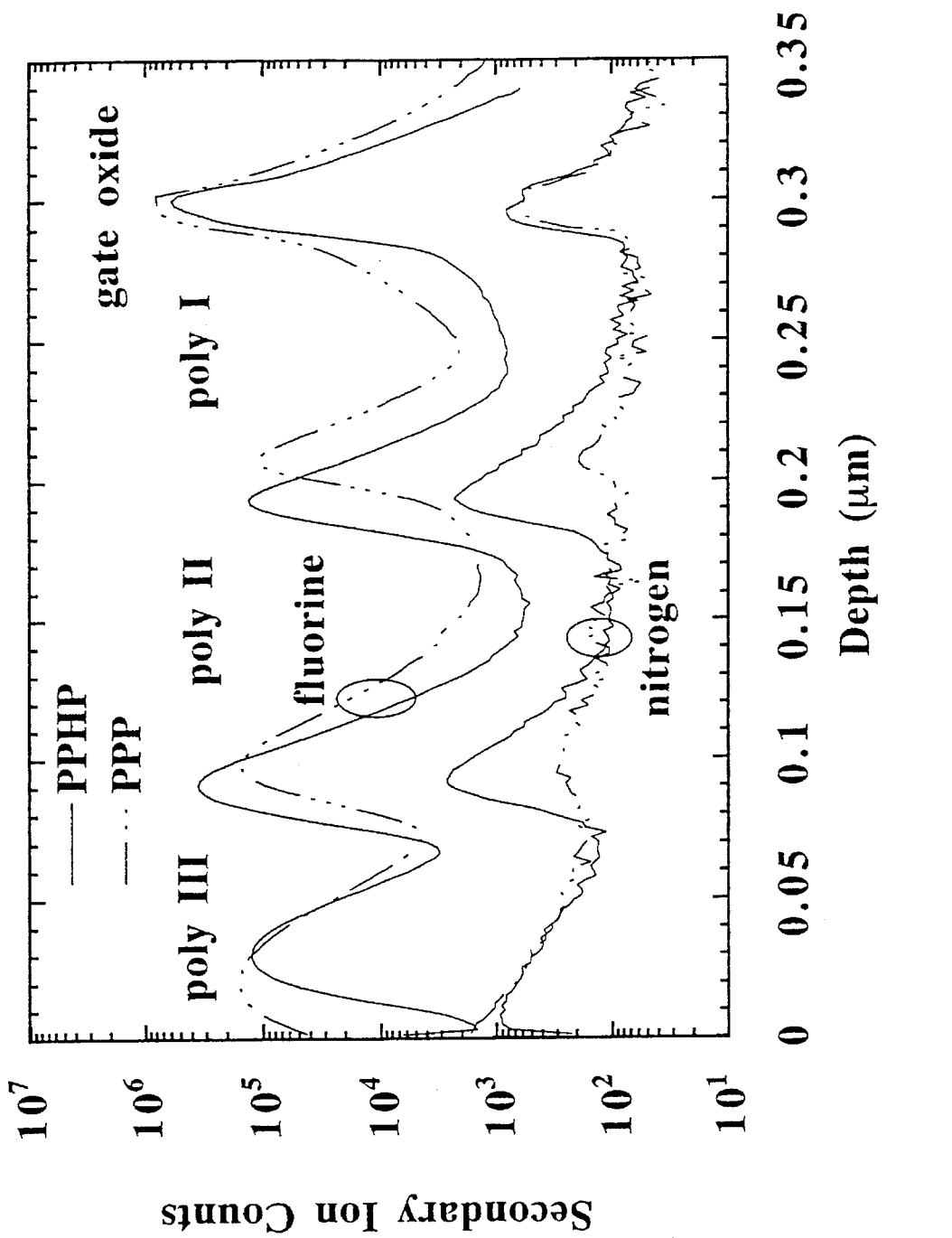
FIG. 2 is a diagram showing the SIMS-analysis nitrogen and fluorine distribution profiles of the multi-layer polysilicon gate structure according to the present invention (PPHP) and the conventional multi-layer polysilicon gate structure (PPP) after being annealed for 40 minutes at 900° C.

FIG. 2 shows the distribution profiles of the nitrogen ion and the fluorine ion in a PPHP and a PPP structure annealed at 900° C. for 40 minutes by an SIMS (secondary ion mass spectrometry) analysis, wherein poly I and poly II means the first polysilicon layer 3 and poly III means the second polysilicon layer 5. Concerning PPHP, nitridizing the interface 31 between the first polysilicon layer 3 and the second polysilicon layer 5 generates and gathers many nitrogen atoms not only in the interface 31 but in the polysilicon layer under interface 31 and an interface 21 between the polysilicon layer and the gate oxide layer 2. These nitrogen atoms stop the fluorine from spreading out. Therefore, it is seen from the profile that PPHP has more fluorine atoms gathered in the interface of polysilicon layers, and thus can better reduce the fluorine atoms in the gate oxide layer. For a $P^+$-type polysilicon gate structure (PPHP) implanted by $BF_2^+$ ions, nitridizing the polysilicon gate suppresses the effect of boron penetration urged by the flourine ion through the gate oxide layer so as to enhance the device reliability.

Figure 3:
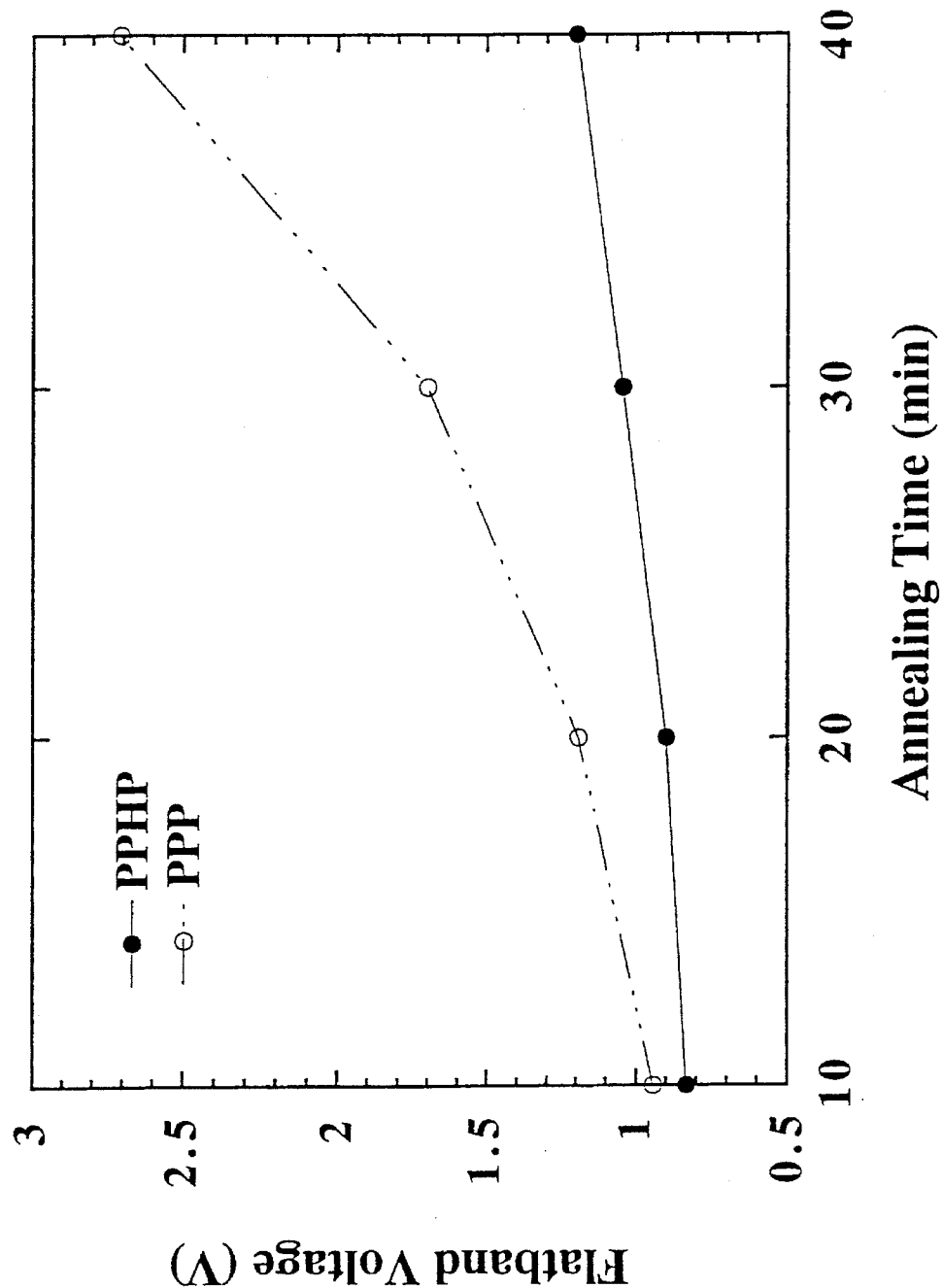
FIG. 3 is a diagram showing the relationship between the flatband voltage and the annealing time for PPHP and PPP.
Figure 4:
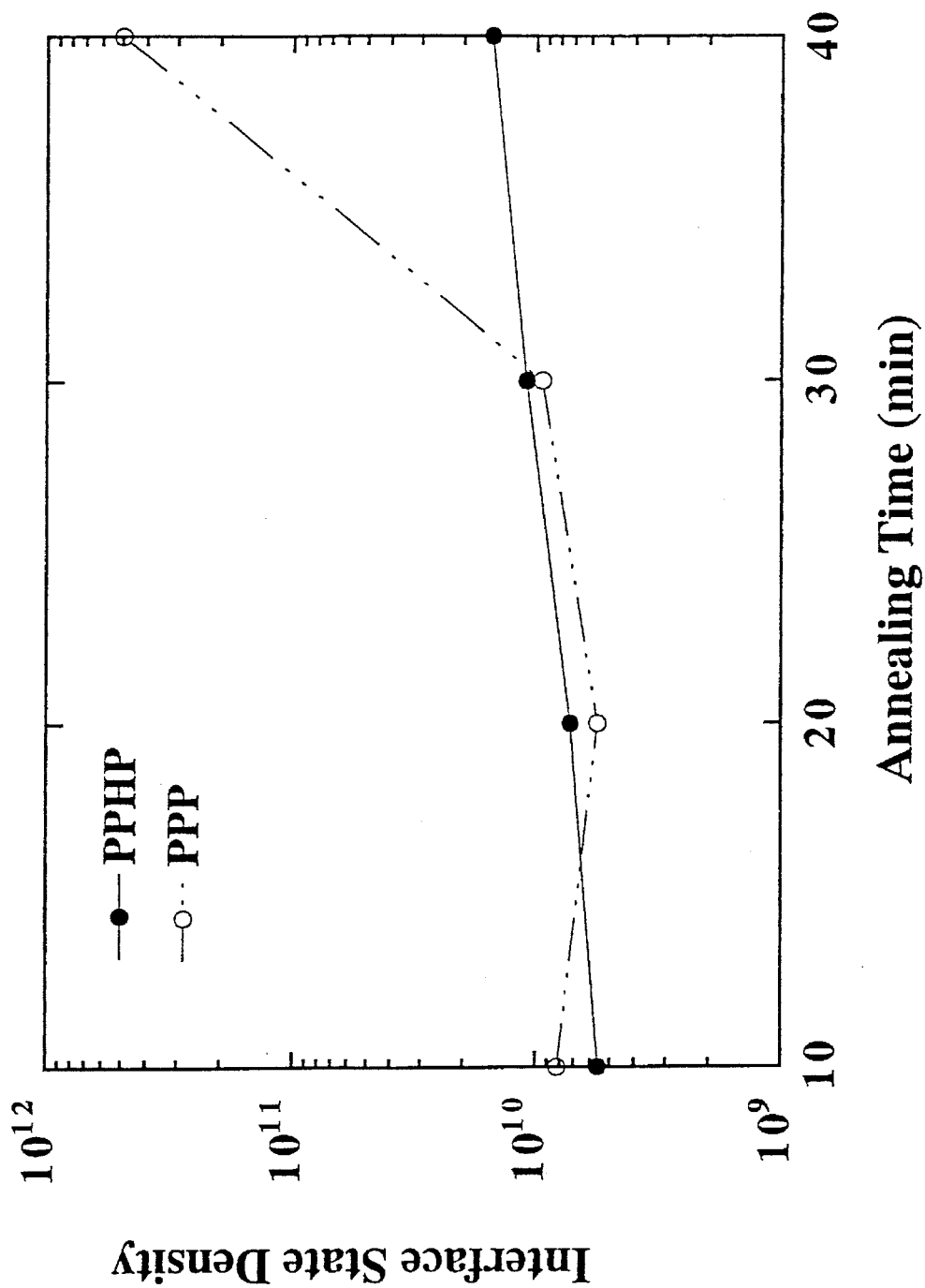
FIG. 4 is a diagram showing the relationship between of interface state density and annealing time for PPHP and PPP.

FIG. 3 and FIG. 4 respectively show flat-band voltage and interface state density changing with the annealing time. The variation of the flatband voltage ($V_{fb}$) or the interface state density ($D_{it}$) of a nitridized polysilicon gate structure (PPHP) with the increase of annealing time is relatively small in comparison with that of PPP. The flatband voltage remains around 1 voltage and the interface state density maintains at an amount that is extremely small (~$10^{10}$ state/$cm^2$/eV).

Figure 5:
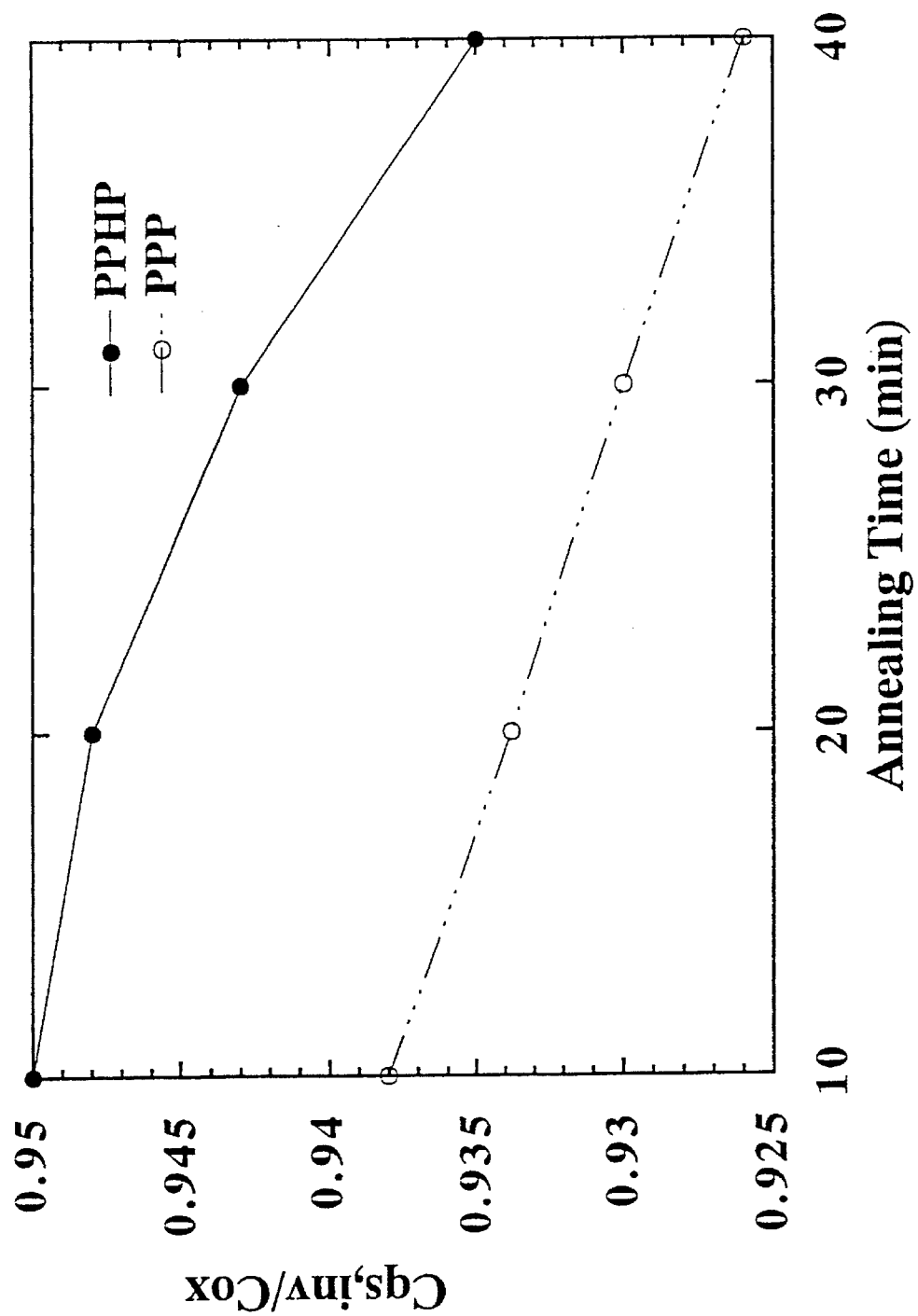
FIG. 5 is a diagram showing the changing depletion effect of polysilicon gate of PPHP and PPP with the increase of annealing time.

FIG. 5 shows the variation of polysilicon depletion effect with the annealing time. A PPHP structure has larger Cqs, inv/Cox (normalized quasi-static inversion capacitance) than a PPP structure has. In other words, the PPHP structure presents smaller polysilicon gate depletion effect which enables the device to work normally.

Figure 6:
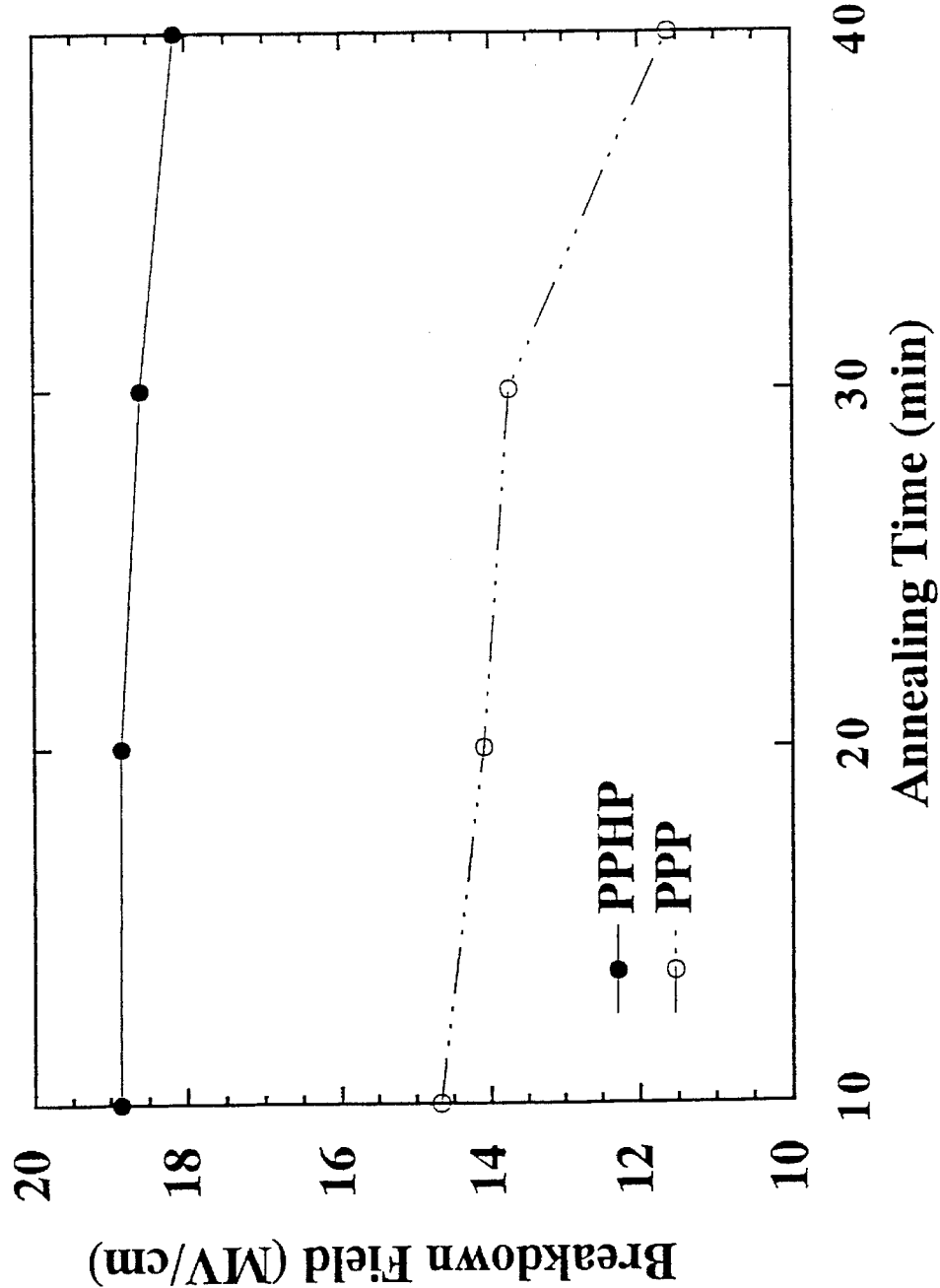
FIG. 6 is a diagram showing the changing breakdown field of PPHP and PPP with the increase of annealing time.
Figure 7:
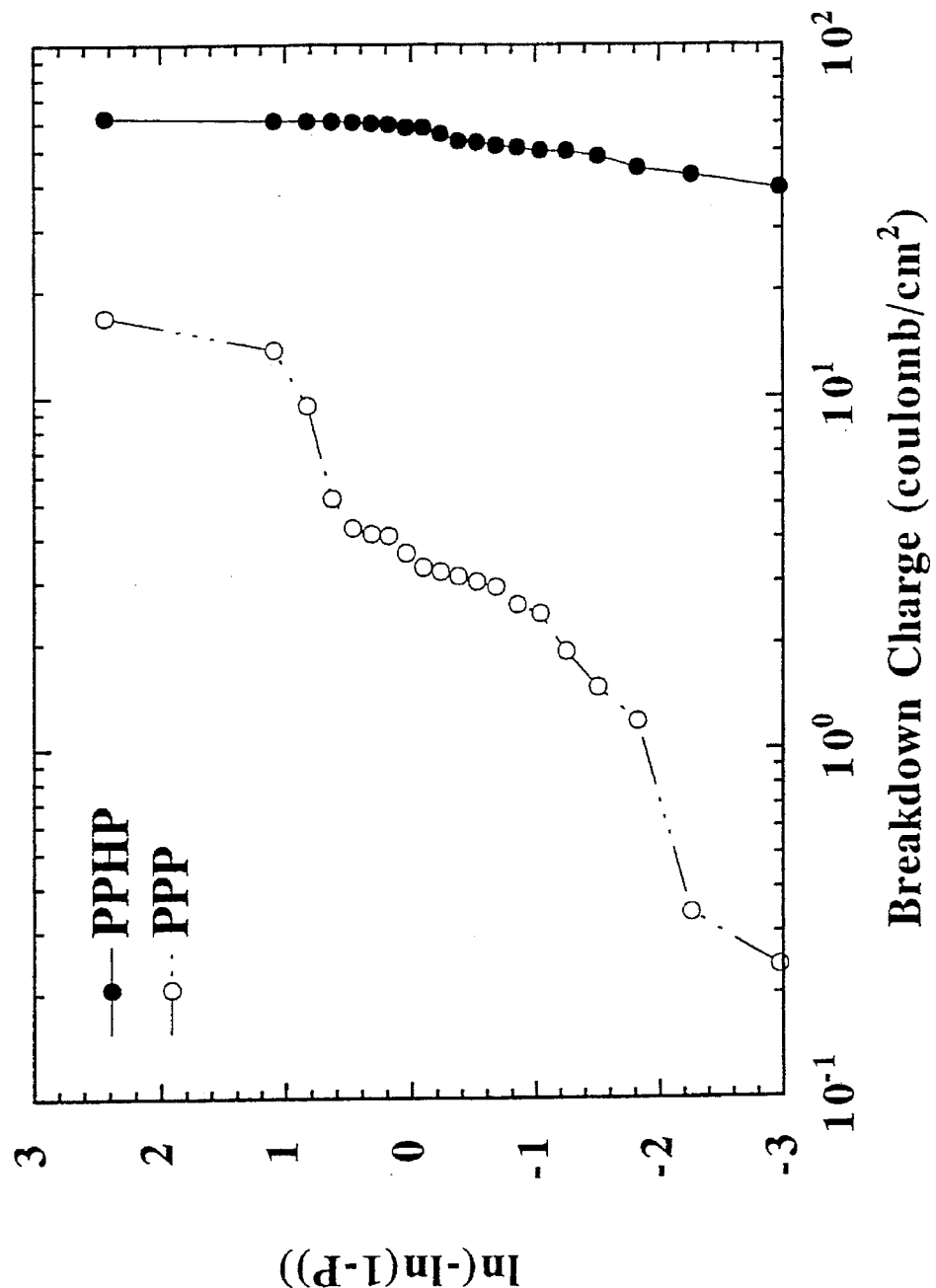
FIG. 7 is a Weiball breakdown charge distribution profile for PPHP and PPP annealed at 900° C. for 10 minutes.

FIG. 6 shows the variation of a breakdown field with the increase of annealing time, and FIG. 7 shows a Weiball distribution of the breakdown charge wherein P means the accumulation rate. The breakdown field ($E_{bd}$) and breakdown charge ($Q_{bd}$) Of the PPHP structure are much larger than those of the PPP structure. Particularly the breakdown field of the PPHP structure can reach over 18 MV/cm and the breakdown charge can be as large as 58 coulomb/$cm^2$ which proves that nitridizing a polysilicon gate can not only suppress boron penetration but also diminish the stress at the interface and effectively improve device properties due to the nitridation effect in gate oxide interface.

Figure 8:
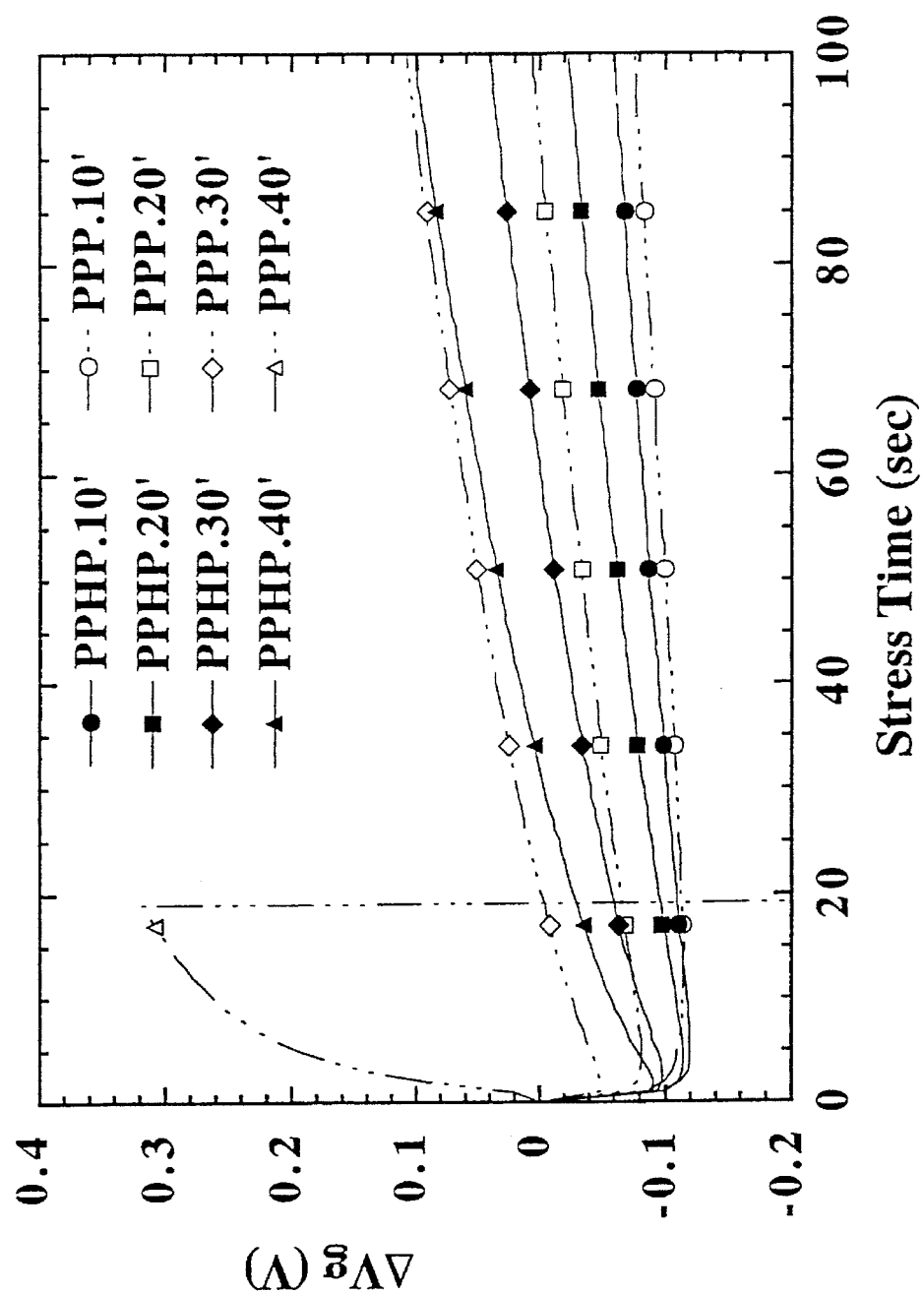
FIG. 8 is a diagram showing how the gate voltage variation changes with the time when PPHP and PPP annealed at 900° C. for different time are respectively subject to a 10 mA/cm$^2$ constant current stress.

FIG. 8 shows variations of the gate voltage with the stress time for PPHP and PPP structures respectively subject to 10 mA/$cm^2$ constant current stress under different post-implantation annealing time. The electron trapping rate increases with the increase for the annealing time, but the increment for PPHP structure is smaller than that for PPP structure and will not affect the normal work of the device.

Figure 9:
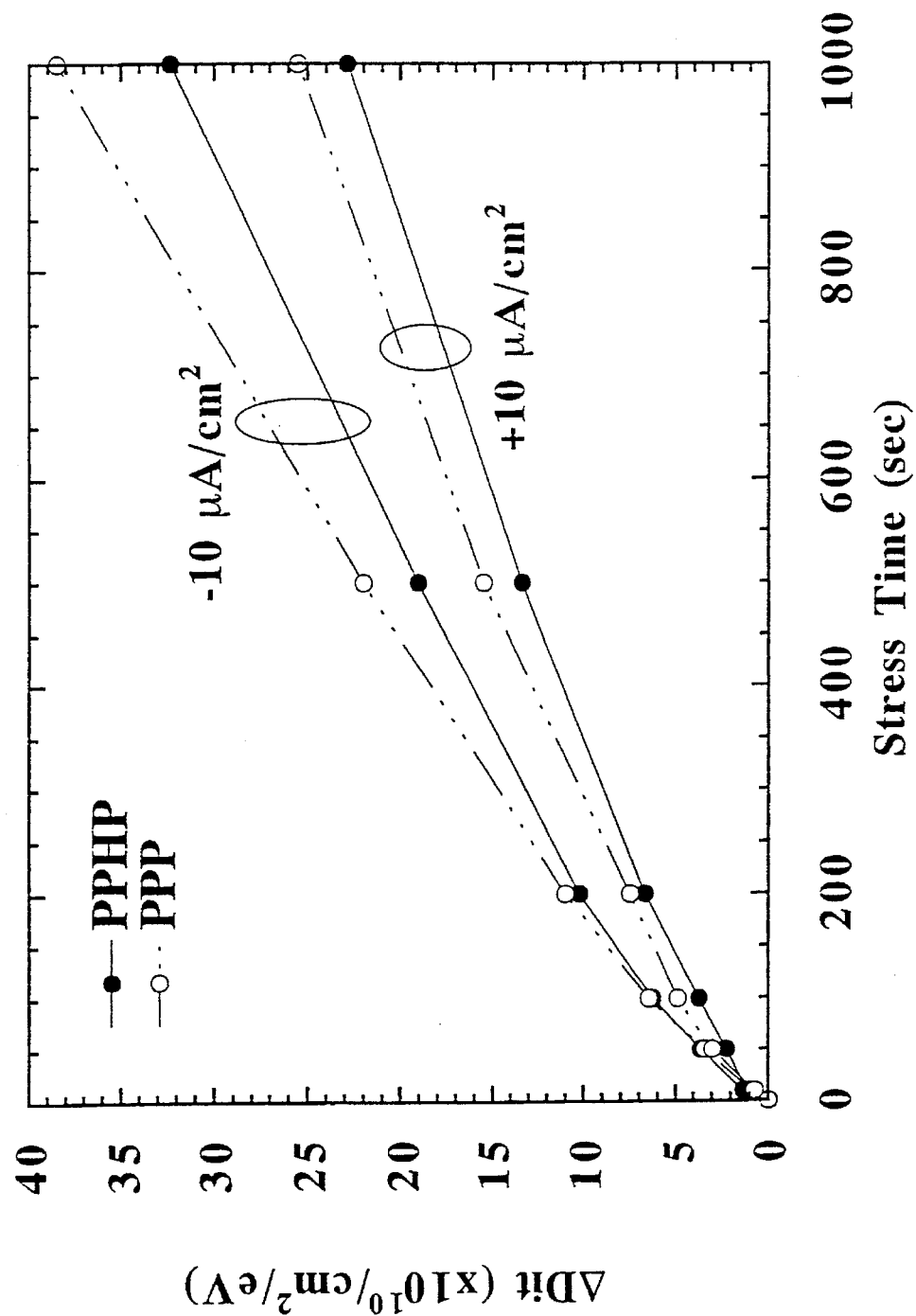
FIG. 9 shows how the interface state density varies with the time when the 900° C.-and-10-min-annealed PPHP and PPP are respectively subject to the constant current stress (+10 mA/cm$^2$ and -10 mA/cm$^2$)
Figure 10:
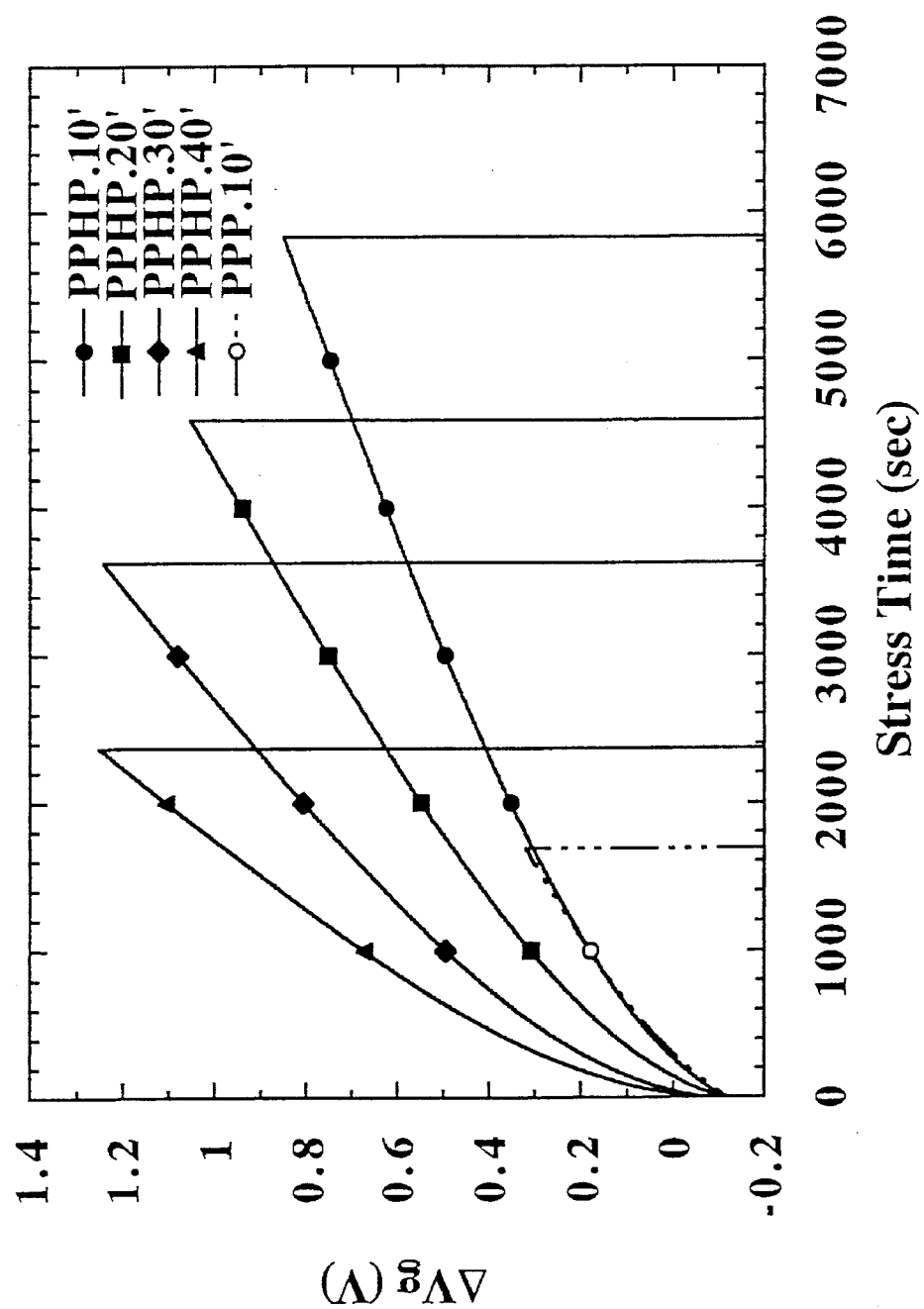
FIG. 10 is a diagram showing how the gate voltage varies with the stress time when the constant current stress (10 mA/cm$^2$) is applied to PPHP and PPP.

FIG. 9 shows how the interface state density varies with time when the 900° C.-and-10-min-annealed PPHP and PPP structures are subject to under the construct current stress (+10 mA/$cm^2$ and −10 mA/$cm^2$). FIG. 10 shows a gate voltage vs. time plot for PPHP and PPP structures annealed at 900° C. for 10 minutes when subject to the constant current of 10 mA/$cm^2$. In the prior art, nitridizing the gate oxide with $NH_3$ leads to the increases of the interface state generation rate and the electron trapping rate which can be avoided by nitridizing polysilicon gate instead to obtain a PPHP structure.

From the above illustration, it is known that the present invention nitridizes the polysilicon gate instead of the gate oxide in the prior art, which can effectively suppress boron penetration, avoid drawbacks resulting from nitridizing a gate oxide, and moreover, improve the device properties owing to the slight nitridation effect in the polysilicon gate and the gate oxide interface.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of suppressing boron penetration in a PMOS with a nitridized polysilicon gate comprising the steps of:

1) growing a layer of gate oxide on a substrate;
   2) forming at least one first polysilicon layer on said gate oxide layer;
   3) nitridizing said at least one first polysilicon layer;
   4) removing a layer of nitridized silicon which is generated by said nitridizing step 3) on said at least one first polysilicon layer;
   5) forming a second polysilicon layer on said at least one first polysilicon layer; and
   6) implanting B-containing ions into said first and second polysilicon layers for constructing a PMOS structure wherein said nitridizing step suppresses a boron ion from penetration into said substrate.

2. A method according to claim 1 wherein said B-containing ions are $BF_2^+$ ions.

3. A method according to claim 1 wherein said substrate is a Si-based substrate.

4. A method according to claim 1, wherein said at least one means two.

5. A method according to claim 4, wherein said Si substrate in said step 1) is an N-type Si substrate in a direction of (1, 0, 0) with a resistivity of 5~10 $\Omega/cm^2$.

6. A method according to claim 5, wherein said gate oxide layer in said step 2) is grown for 80 minutes in a condition that rates of $O_2$ volume over time and $N_2$ volume over time are in a ratio of 1:6 at 900° C.

7. A method according to claim 6, wherein a thickness of said gate oxide layer in said step 2) is 80Å.

8. A method according to claim 7, wherein said at least one first polysilicon layer is grown to a thickness of 1000Å under 625° C. in a low-pressure CVD (LPCVD) system.

9. A method according to claim 8, wherein $NH_3$ is used for said nitridation in said step 3).

10. A method according to claim 9, wherein step 3) is taken place under a nitridation pressure of 120 mtorr at 900° C. for 80 minutes.

11. A method according to claim 10, wherein said second polysilicon layer in said step 5) is grown at 625° C. in a LPCVD system and has a thickness of 1000Å.

12. A method according to claim 11, wherein in said step 6), an ion implantation energy is 50 kev and an ion implanting dosage is $5 \times 10^{15}$ number/$cm^2$.

13. A method according to claim 12, wherein said step 6) is followed by steps of:

annealing said substrate in $O_2$ at 800° C. for 30 minutes to form a polysilicon oxide layer on said second polysilicon layer; and annealing said substrate in $N_2$ at 900° C. for 10–40 minutes to activate said boron-containing ions.

14. A method according to claim 13 further including after annealing said substrate in said $N_2$ a step of:

using diluted HF to remove said polysilicon oxide layer generated in said $O_2$-annealing step.

* * * * *